(12) United States Patent  
Kikuchi et al.

(10) Patent No.: US 8,781,059 B2  
(45) Date of Patent: Jul. 15, 2014

(54) SHIFT REGISTER (75) Inventors: Tetsuo Kikuchi, Osaka (JP); Shinya Tanaka, Osaka (JP); Junya Shimada, Osaka (JP); Chikao Yamasaki, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 76 days.

(21) Appl. No.: 13/637,367

(22) PCT Filed: Jan. 6, 2011

(86) PCT No.: PCT/JP2011/050088  
§ 371 (c)(1),  
(2), (4) Date: Sep. 26, 2012

(87) PCT Pub. No.: WO2011/148655  
PCT Pub. Date: Dec. 1, 2011

(65) Prior Publication Data  
US 2013/0028370 A1  Jan. 31, 2013

(30) Foreign Application Priority Data  
May 24, 2010 (JP) .................................. 2010-118646

(51) Int. Cl.  
*G11C 19/00* (2006.01)

(52) U.S. Cl.  
USPC .................................. 377/64; 377/78; 377/79

(58) Field of Classification Search  
None  
See application file for complete search history.

(56) References Cited

U.S. PATENT DOCUMENTS

| | | | |
|---|---|---|---|
| 5,222,082 A | 6/1993 | Plus | |
| 5,434,899 A | 7/1995 | Huq et al. | |
| 5,701,136 A * | 12/1997 | Huq et al. | 345/100 |
| 5,949,398 A * | 9/1999 | Kim | 345/100 |
| 6,052,426 A * | 4/2000 | Maurice | 377/78 |
| 6,064,713 A * | 5/2000 | Lebrun et al. | 377/67 |
| 7,460,634 B2 * | 12/2008 | Deane | 377/64 |
| 8,493,309 B2 * | 7/2013 | Tobita | 345/98 |
| 8,508,457 B2 * | 8/2013 | Kretz et al. | 345/100 |
| 2005/0008114 A1 | 1/2005 | Moon | |
| 2006/0132182 A1 | 6/2006 | Kikuchi | |
| 2011/0134090 A1* | 6/2011 | Iwamoto et al. | 345/206 |
| 2011/0292007 A1* | 12/2011 | Ohhashi | 345/204 |
| 2012/0082287 A1* | 4/2012 | Moriwaki | 377/64 |
| 2013/0136224 A1* | 5/2013 | Qing et al. | 377/64 |

FOREIGN PATENT DOCUMENTS

| | | |
|---|---|---|
| JP | 08-087897 A | 4/1996 |
| JP | 10-500243 A | 1/1998 |

(Continued)

OTHER PUBLICATIONS

Official Communication issued in International Patent Application No. PCT/JP2011/050088, mailed on Apr. 19, 2011.

*Primary Examiner* — Tuan T Lam  
(74) *Attorney, Agent, or Firm* — Keating & Bennett, LLP (57) ABSTRACT

A shift register is formed by connecting unit circuits 11 in multi-stage. One electrode of a capacitor Cap2 in the unit circuit 11 is connected to the gate terminal (node N1) of a transistor T2, and the other connected to a node N2. A compensation circuit composed of transistors T3 to T5 provides a clock signal CKB to the node N2 when the node N1 potential is at low level, and applies a low-level potential to the node N2 when the node N1 potential is at high level. Accordingly, even when the gate potential of the transistor T2 changes with a change in a clock signal CK, a signal that cancels out the change is provided through the capacitor Cap2, stabilizing the gate potential of the transistor T2. Thus, a change in the control terminal potential of an output transistor associated with a change in a clock signal is prevented.

7 Claims, 11 Drawing Sheets

(56) References Cited

FOREIGN PATENT DOCUMENTS

| | | |
|---|---|---|
| JP | 11-502355 A | 2/1999 |
| JP | 2005-050502 A | 2/2005 |
| JP | 2006-178165 A | 7/2006 |
| WO | 92/15992 A1 | 9/1992 |
| WO | 95/31804 A1 | 11/1995 |
| WO | 97/25716 A1 | 7/1997 |
| WO | 2010/050262 A1 | 5/2010 |

* cited by examiner

SHIFT REGISTER

TECHNICAL FIELD

The present invention relates to a shift register and more particularly to a shift register to be favorably used in a drive circuit of a display device, or the like.

BACKGROUND ART

An active matrix-type display device displays an image by selecting two-dimensionally arranged pixel circuits on a row-by-row basis and writing grayscale voltages according to a video signal to the selected pixel circuits. Such a display device is provided with a scanning signal line drive circuit including a shift register, to select pixel circuits on a row-by-row basis.

For a method of making a display device small, there is known a method in which a scanning signal line drive circuit is integrally formed with pixel circuits on a display panel, using a fabrication process for forming TFTs (Thin Film Transistors) in the pixel circuits. The scanning signal line drive circuit is formed using, for example, amorphous silicon TFTs. A display panel having an integrally formed scanning signal line drive circuit is also called a gate driver monolithic panel.

Figure 15:
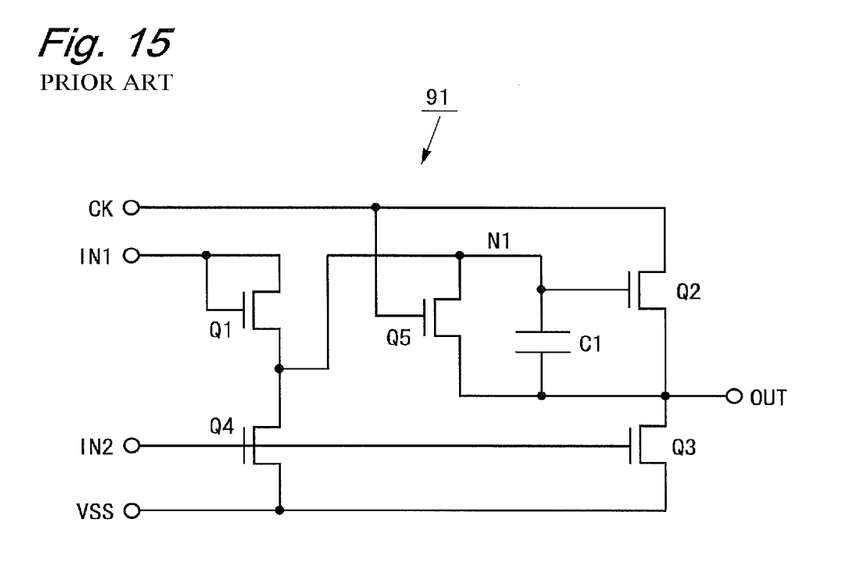
FIG. 15 is a circuit diagram of a unit circuit of a conventional shift register.

For a shift register included in a scanning signal line drive circuit, various types of circuits are conventionally known (e.g., Patent Documents 1 to 3). Patent Document 1 describes a shift register in which unit circuits 91 shown in FIG. 15 are connected in multi-stage. Each unit circuit 91 includes five transistors Q1 to Q5 and a capacitor C1. The transistor Q2 functions as an output transistor that changes an output signal OUT from the shift register to a predetermined level (here, high level). Patent Documents 2 and 3 also describe shift registers in which unit circuits, each including an output transistor, are connected in multi-stage.

Figure 16:
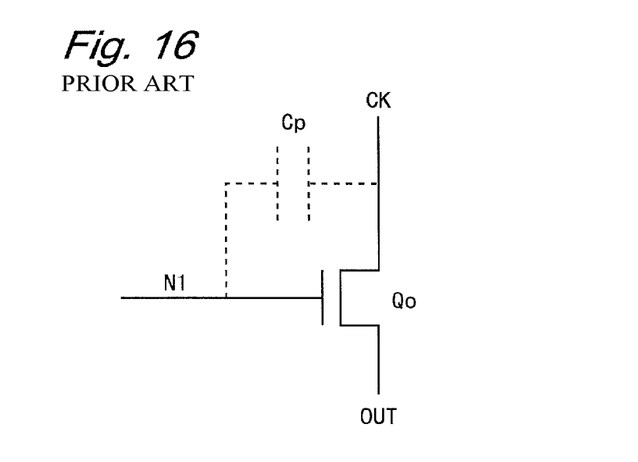
FIG. 16 is a diagram showing a connection configuration of an output transistor included in a unit circuit of a shift register.

FIG. 16 is a diagram showing a connection configuration of an output transistor. As shown in FIG. 16, a clock signal CK is provided to the drain terminal of an output transistor Qo, the gate terminal is connected to a node N1, and the source terminal is connected to an output terminal OUT. In this circuit, a parasitic capacitance Cp occurs between the gate and drain of the output transistor Qo. Hence, when the clock signal CK changes, the potential at the node N1 also changes through the parasitic capacitance Cp. In particular, when the clock signal CK changes to high level while the potential at the node N1 is at low level, the potential at the node N1 becomes higher than a normal low-level potential. Hence, leakage current of the output transistor Qo increases and thus the low-level potential of an output signal OUT becomes unstable.

To solve this problem, the unit circuit 91 includes the transistor Q5. In the unit circuit 91, when the clock signal CK goes to high level, the transistor Q5 is placed in on state and a low-level potential of the output signal OUT is applied to the node N1. By thus repeatedly applying a low-level potential to the node N1, the low-level potential of the output signal OUT can be stabilized.

PRIOR ART DOCUMENTS

Patent Documents

[Patent Document 1] Japanese Laid-Open Patent Publication No. 2005-50502

[Patent Document 2] International Publication Pamphlet No. WO 92/15992

[Patent Document 3] Japanese Laid-Open Patent Publication No. 8-87897

SUMMARY OF THE INVENTION

Problems to be Solved by the Invention

However, the conventional shift register in which the unit circuits 91 are connected in multi-stage has the following problems. In the unit circuit 91, the threshold voltage of the transistor Q5 increases due to aging (deterioration over time). Hence, if the conventional shift register is made to operate for a long time, then the on-current of the transistor Q5 decreases and thus the potential at the node N1 cannot be pulled down to low level during a high-level period of the clock signal CK. In addition, there is another problem that since a new parasitic capacitance occurs between the gate and drain of the transistor Q5, the potential at the node N1 changes more easily when the clock signal CK changes.

An object of the present invention is therefore to provide a shift register that prevents a change in the control terminal potential of an output transistor associated with a change in a clock signal.

Means for Solving the Problems

According to a first aspect of the present invention, there is provided a shift register that has a configuration in which a plurality of unit circuits are connected in multi-stage, and that operates based on a plurality of clock signals, wherein each of the unit circuits includes: an output transistor having a first conduction terminal to which a clock signal is provided, and having a second conduction terminal connected to an output node; a set transistor that applies an on-potential to a control terminal of the output transistor, according to a set signal provided thereto; a reset transistor that applies an off-potential to the control terminal of the output transistor, according to a reset signal provided thereto; and a capacitor having one electrode connected to the control terminal of the output transistor and having another electrode to which is provided a signal for stabilizing the off-potential at the control terminal of the output transistor.

According to a second aspect of the present invention, in the first aspect of the present invention, a signal that changes in an opposite direction to that of the clock signal provided to the output transistor is provided to the other electrode of the capacitor.

According to a third aspect of the present invention, in the second aspect of the present invention, the unit circuit further includes a compensation circuit that provides an opposite-phase clock signal of opposite phase to the clock signal provided to the output transistor, to a node connected to the other electrode of the capacitor when a control terminal potential of the output transistor is an off-potential, and applies an off-potential to the node when the control terminal potential is an on-potential.

According to a fourth aspect of the present invention, in the third aspect of the present invention, the compensation circuit includes a first transistor that applies an off-potential to the node, according to the clock signal; a second transistor that applies an on-potential to the node, according to the opposite-phase clock signal; and a third transistor that applies an off-potential to the node when the control terminal potential of the output transistor is an on-potential.

According to a fifth aspect of the present invention, in the fourth aspect of the present invention, the compensation circuit further includes a fourth transistor that applies an off-potential to the control terminal of the output transistor when a potential at the node is an on-potential.

According to a sixth aspect of the present invention, in the second aspect of the present invention, the capacitance has a capacitor comparable to that of a parasitic capacitance between the first conduction terminal and the control terminal of the output transistor.

According to a seventh aspect of the present invention, in the first aspect of the present invention, an output signal from a unit circuit of a next stage is provided to the other electrode of the capacitor.

According to an eighth aspect of the present invention, in the first aspect of the present invention, the transistors included in the unit circuit are composed of bottom-gate transistors, and the capacitor is formed separately from the transistors connected to the control terminal of the output transistor.

According to a ninth aspect of the present invention, in the first aspect of the present invention, the transistors included in the unit circuit are composed of bottom-gate transistors, and the capacitor is formed as a parasitic capacitance between a control terminal and one conduction terminal of a transistor connected to the control terminal of the output transistor.

According to a tenth aspect of the present invention, in the first aspect of the present invention, the unit circuit further includes an output reset transistor that applies an off-potential to the output node, according to the reset signal.

Effects Of The Invention

According to the first aspect of the present invention, to the control terminal of the output transistor is provided a signal for stabilizing the off-potential at the control terminal, through the capacitor. By this, even when the control terminal potential of the output transistor changes with a change in a clock signal, a signal that cancels out the change is provided through the capacitor, enabling to stabilize the control terminal potential of the output transistor. In addition, by using the capacitor when providing the signal to the control terminal of the output transistor, the capability to stabilize the control terminal potential of the output transistor can be maintained even after a lapse of a long time.

According to the second aspect of the present invention, a signal that changes in an opposite direction to that of the clock signal provided to the output transistor is provided to the control terminal of the output transistor through the capacitor. By this, even when the control terminal potential of the output transistor changes with a change in a clock signal, a signal that cancels out the change is provided through the capacitor, enabling to stabilize the control terminal potential of the output transistor.

According to the third aspect of the present invention, by using a compensation circuit that provides an opposite-phase clock signal and an off-potential in a switching manner according to the control terminal potential of the output transistor, an output signal can be properly outputted when the control terminal potential is an on-potential, and the control terminal potential can be stabilized at an off-potential when the control terminal potential is an off-potential.

According to the fourth aspect of the present invention, a compensation circuit that provides an opposite-phase clock signal and an off-potential in a switching manner according to the control terminal potential of the output transistor can be formed using three transistors.

According to the fifth aspect of the present invention, by providing a fourth transistor, a change in the control terminal potential of the output transistor associated with a change in an output signal can be prevented.

According to the sixth aspect of the present invention, by providing a capacitor having a capacitance comparable to that of a parasitic capacitance between the first conduction terminal and control terminal of the output transistor, a change in the control terminal potential of the output transistor associated with a change in a clock signal can be effectively prevented.

According to the seventh aspect of the present invention, by providing an output signal from a unit circuit of a next stage to the other electrode of the capacitor, even when the control terminal potential of the output transistor changes with a change in a clock signal, a signal that cancels out the change is provided through the capacitor, enabling to stabilize the control terminal potential of the output transistor.

According to the eighth or ninth aspect of the present invention, a capacitor having one electrode connected to the control terminal of the output transistor can be easily formed using the same fabrication process as that for bottom-gate transistors.

According to the tenth aspect of the present invention, by providing an output reset transistor, the potential of the output signal can be more securely controlled to an off-potential.

MODES FOR CARRYING OUT THE INVENTION

Figure 1:
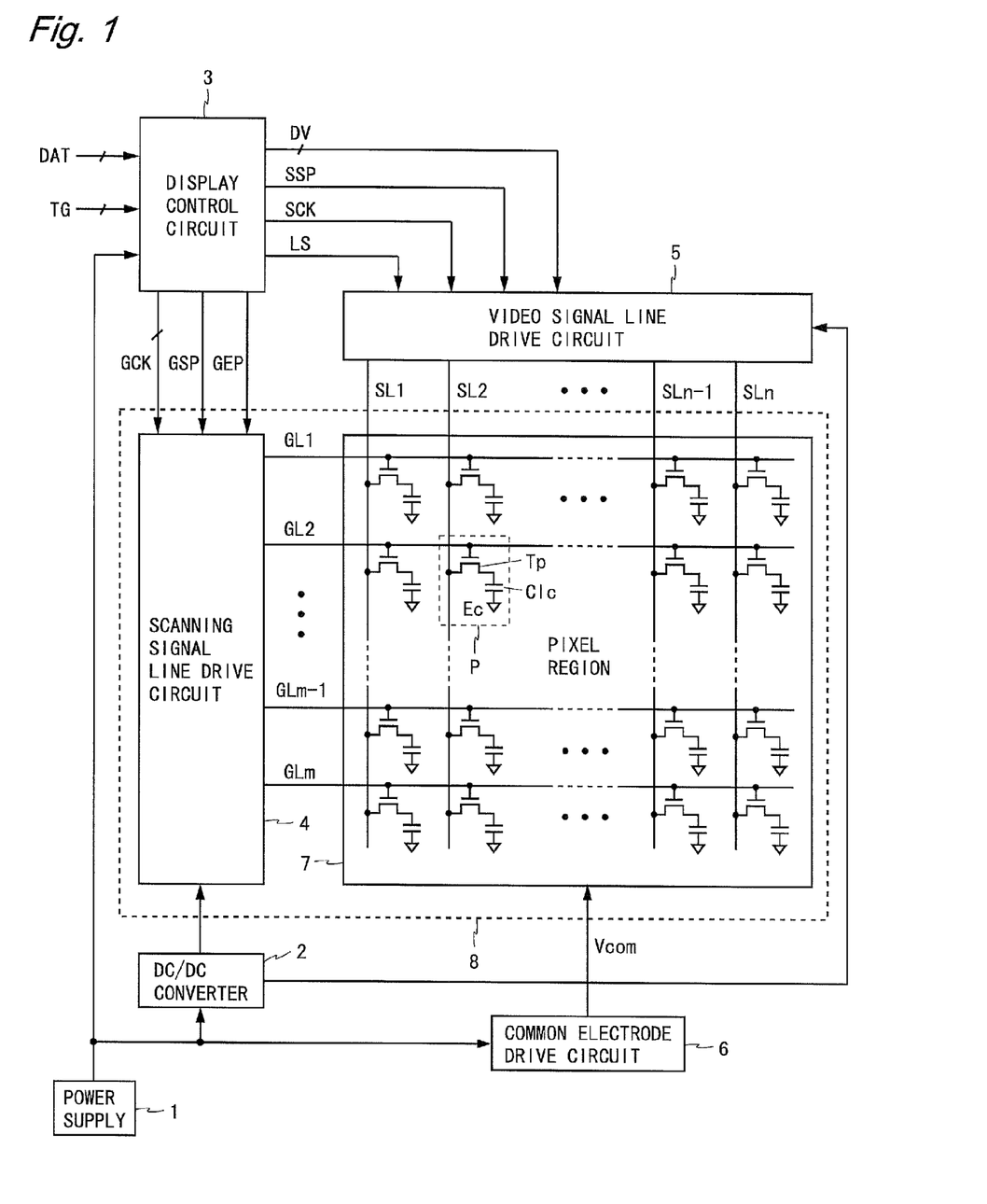
FIG. 1 is a block diagram showing a configuration of a liquid crystal display device according to an embodiment of the present invention.

FIG. 1 is a block diagram showing a configuration of a liquid crystal display device according to an embodiment of the present invention. The liquid crystal display device shown in FIG. 1 is an active matrix-type display device including a power supply 1, a DC/DC converter 2, a display control circuit 3, a scanning signal line drive circuit 4, a video signal line drive circuit 5, a common electrode drive circuit 6, and a pixel region 7. The scanning signal line drive circuit 4 and the video signal line drive circuit 5 are also called a gate driver circuit and a source driver circuit, respectively. In the following, m and n are integers not less than 2.

The pixel region 7 includes m scanning signal lines GL1 to GLm, n video signal lines SL1 to SLn, and (m×n) pixel circuits P. The scanning signal lines GL1 to GLm are arranged parallel to one another, and the video signal lines SL1 to SLn are arranged parallel to one another so as to intersect with the scanning signal lines GL1 to GLm. The (m×n) pixel circuits P are arranged two-dimensionally at the respective intersections of the scanning signal lines GL1 to GLm and the video signal lines SL1 to SLn.

The pixel circuit P includes a transistor Tp and a liquid crystal capacitor Clc. The gate terminal of the transistor Tp is connected to a corresponding scanning signal line, the source terminal is connected to a corresponding video signal line, and the drain terminal is connected to one electrode of the liquid crystal capacitor Clc. The other electrode of the liquid crystal capacitor Clc is a common electrode Ec that faces all of the pixel circuits P. The pixel circuit P functions as a single pixel (or a single subpixel). Note that the pixel circuit P may include an auxiliary capacitor in parallel with the liquid crystal capacitor Clc.

The power supply 1 supplies predetermined power supply voltages to the DC/DC converter 2, the display control circuit 3, and the common electrode drive circuit 6. The DC/DC converter 2 generates predetermined direct-current voltages based on the power supply voltage supplied from the power supply 1 and supplies the direct-current voltages to the scanning signal line drive circuit 4 and the video signal line drive circuit 5. The common electrode drive circuit 6 applies a predetermined potential Vcom to the common electrode Ec.

The display control circuit 3 outputs a digital video signal DV and a plurality of control signals, based on an image signal DAT and a timing signal group TG which are provided from the outside. The timing signal group TG includes a horizontal synchronizing signal, a vertical synchronizing signal, and the like. The control signals outputted from the display control circuit 3 include a source start pulse signal SSP, a source clock signal SCK, a latch strobe signal LS, a gate clock signal GCK, a gate start pulse signal GSP, and a gate end pulse signal GEP.

The scanning signal line drive circuit 4 selects a single scanning signal line in turn from among the scanning signal lines GL1 to GLm based on the gate clock signal GCK, the gate start pulse signal GSP, and the gate end pulse signal GEP which are outputted from the display control circuit 3, and applies a potential (high-level potential) that places the transistors Tp in on state to the selected scanning signal line. By this, n pixel circuits P connected to the selected scanning signal line are selected collectively.

The video signal line drive circuit 5 applies n grayscale voltages according to the digital video signal DV to the video signal lines SL1 to SLn, respectively, based on the digital video signal DV, the source start pulse signal SSP, the source clock signal SCK, and the latch strobe signal LS which are outputted from the display control circuit 3. By this, n grayscale voltages are respectively written to n pixel circuits P selected using the scanning signal line drive circuit 4. By writing grayscale voltages to all of the pixel circuits P in the pixel region 7 using the scanning signal line drive circuit 4 and the video signal line drive circuit 5, an image based on the image signal DAT can be displayed in the pixel region 7.

The scanning signal line drive circuit 4 is integrally formed on a liquid crystal panel 8 where the pixel region 7 is formed. Transistors (TFTs) included in the scanning signal line drive circuit 4 are formed using, for example, amorphous silicon. Note that all or some of other circuits included in the liquid crystal display device may be integrally formed on the liquid crystal panel 8.

The scanning signal line drive circuit 4 includes a shift register that has a configuration in which a plurality of unit circuits are connected in multi-stage, and that operates based on a plurality of clock signals. The liquid crystal display device according to the embodiment of the present invention has a feature in the circuit configuration of the shift register included in the scanning signal line drive circuit 4. The shift register included in the scanning signal line drive circuit 4 will be described below.

(First Embodiment)

Figure 2:
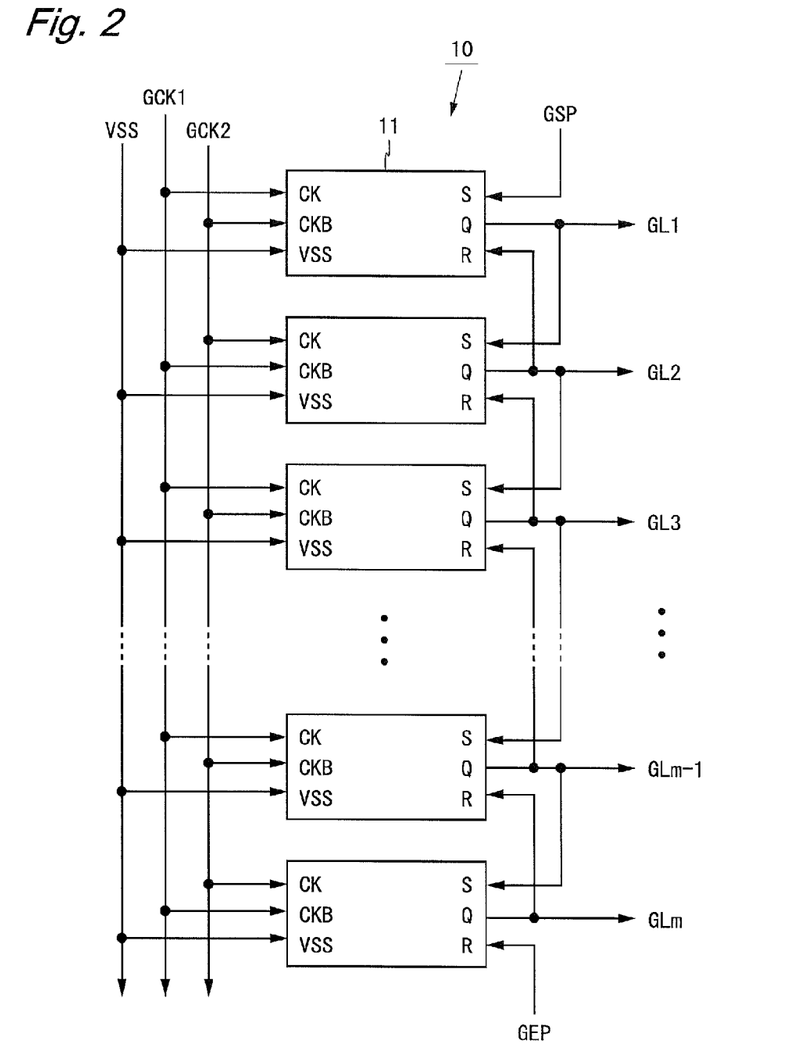
FIG. 2 is a block diagram showing a configuration of a shift register according to a first embodiment of the present invention.

FIG. 2 is a block diagram showing a configuration of a shift register according to a first embodiment of the present invention. A shift register 10 shown in FIG. 2 includes m unit circuits 11 arranged side by side one-dimensionally. A unit circuit 11 which is arranged in an i-th position (i is an integer between 1 and m, inclusive) is hereinafter referred to as an i-th unit circuit.

Figure 3:
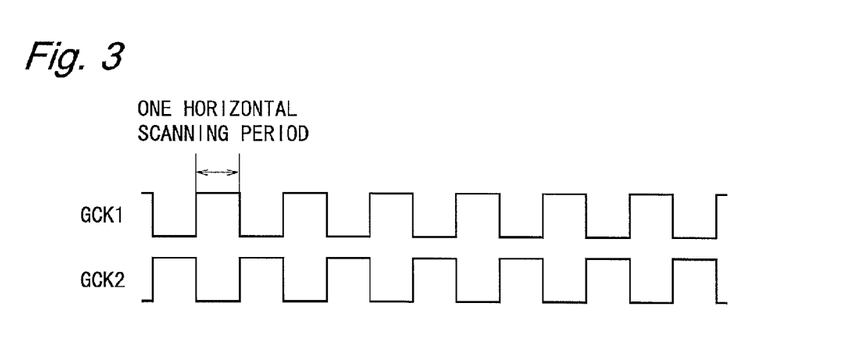
FIG. 3 is a timing chart showing clock signals inputted to the shift register shown in FIG. 2.

Two gate clock signals GCK1 and GCK2 are supplied to the shift register 10 as gate clock signals GCK. In addition, a gate start pulse signal GSP, a gate end pulse signal GEP, and a low-level potential VSS are supplied to the shift register 10. FIG. 3 is a timing chart of the gate clock signals GCK1 and GCK2. As shown in FIG. 3, the gate clock signal GCK2 is a clock signal of opposite phase to the gate clock signal GCK1. The cycle of the gate clock signals GCK1 and GCK2 is two horizontal scanning periods.

Clock signals CK and CKB, a set signal S, a reset signal R, and a low-level potential VSS are inputted to each unit circuit 11, and an output signal Q is outputted from each unit circuit 11. More specifically, the gate clock signals GCK1 and GCK2 are inputted to the odd-numbered unit circuits as the clock signals CK and CKB, respectively. The gate clock signals GCK2 and GCK1 are inputted to the even-numbered unit circuits as the clock signals CK and CKB, respectively. To the first unit circuit is inputted the gate start pulse signal GSP as the set signal S. To each of those unit circuits other than the first one is inputted an output signal Q from a unit circuit of a previous stage, as the set signal S. To the m-th unit circuit is inputted the gate end pulse signal GEP as the reset signal R. To each of those unit circuits other than the m-th one is inputted an output signal Q from a unit circuit of a next stage, as the reset signal R.

Figure 4:
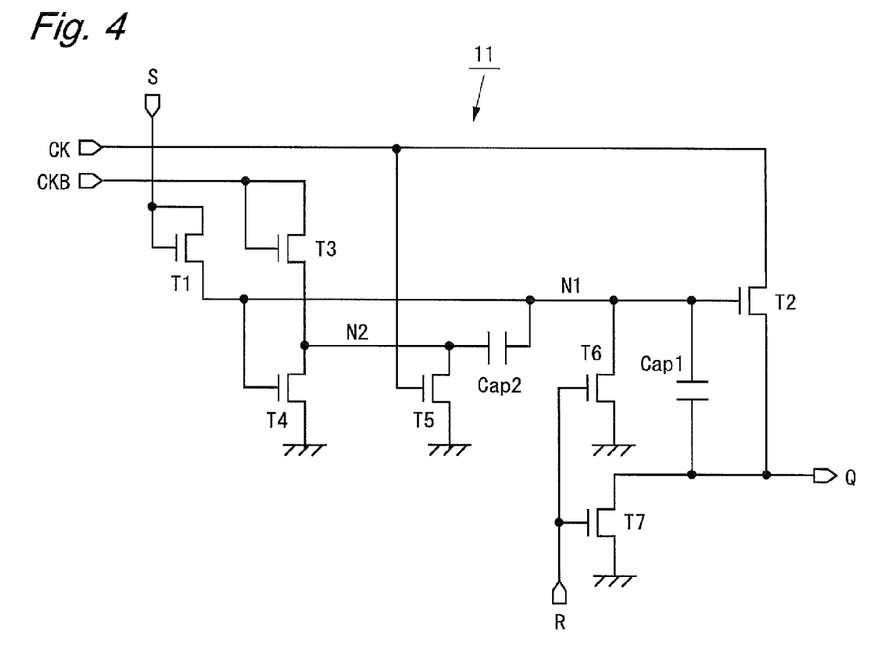
FIG. 4 is a circuit diagram of a unit circuit of the shift register shown in FIG. 2.

FIG. 4 is a circuit diagram of the unit circuit 11. The unit circuit 11 includes, as shown in FIG. 4, seven transistors T1 to T7 and two capacitors Cap1 and Cap2. The transistors T1 to T7 are N-channel TFTs. For the N-channel TFTs, a high-level potential is an on-potential and a low-level potential is an off-potential.

The source terminal of the transistor T1, the drain terminal of the transistor T6, the gate terminals of the transistors T2 and T4, and one electrode of each of the capacitors Cap1 and Cap2 are connected to one node (hereinafter, referred to as the node N1). The source terminal of the transistor T3, the drain terminals of the transistors T4 and T5, and the other electrode of the capacitor Cap2 are connected to another node (hereinafter, referred to as the node N2). The source terminal of the transistor T2, the drain terminal of the transistor T7, and the other electrode of the capacitor Cap1 are connected to an output terminal Q.

The set signal S is provided to the gate and drain terminals of the transistor T1. The clock signal CK is provided to the drain terminal of the transistor T2 and the gate terminal of the transistor T5. The clock signal CKB is provided to the gate and drain terminals of the transistor T3. The reset signal R is provided to the gate terminals of the transistors T6 and T7. The low-level potential VSS is fixedly applied to the source terminals of the transistors T4 to T7. The transistors T1, T2, T6, and T7 function as a set transistor, an output transistor, a reset transistor, and an output reset transistor, respectively.

Figure 5:
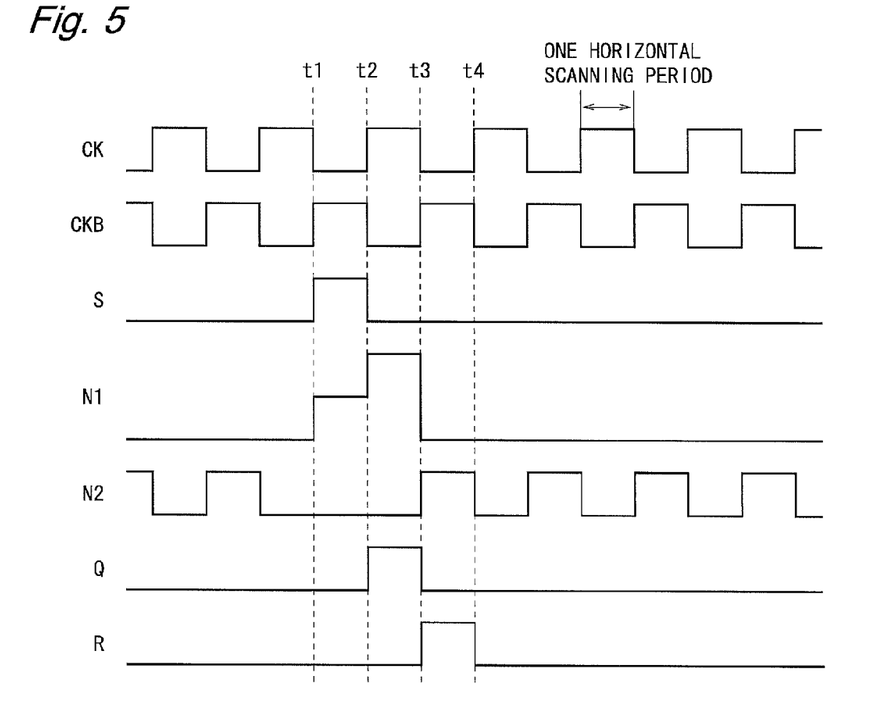
FIG. 5 is a timing chart of the shift register shown in FIG. 2.

FIG. 5 is a timing chart of the shift register 10. As shown in FIG. 5, the clock signals CK and CKB inputted to the unit circuit 11 go to high level alternatively for one horizontal scanning period. Immediately before time t1, the potentials at the nodes N1 and N2 are at low level. At time t1, the set signal S (an output signal from a unit circuit of a previous stage) changes to high level. Since the transistor T1 is diode-connected, when the set signal S is brought to high level, the potential at the node N1 is brought to high level. Accordingly, the transistors T2 and T4 are placed in on state.

In addition, at time t1, the clock signal CK changes to low level and the clock signal CKB changes to high level. Since the transistor T3 is diode-connected, when the clock signal CKB is brought to high level, the potential at the node N2 is pulled in a high-level direction. In addition, after time t1, since the transistor T4 is in on state, the potential at the node N2 is also pulled in a low-level direction. The drive capabilities of the transistors T3 and T4 are determined such that the potential at the node N2 is at low level at this time. Hence, the potential at the node N2 remains at low level even after time t1.

At time t2, the clock signal CK changes to high level and the clock signal CKB and the set signal S change to low level. Accordingly, the transistors T1 and T3 are placed in off state. The clock signal CK is applied to the drain terminal of the transistor T2, and a parasitic capacitance (not shown) exists between the gate and drain of the transistor T2. In addition, the node N1 is in a floating state at this time. Hence, when the drain potential of the transistor T2 rises, the potential at the node N1 rises and thus becomes higher than a normal high-level potential (bootstrap effect). Since the clock signal CK is at high level during time t2 to t3, the potential at the node N1 is higher than the normal high-level potential during substantially the same period, and an output signal Q is at high level during substantially the same period. At this time, a scanning signal line to which the output signal Q is applied is placed in a selected state and thus video signals are written to a plurality of pixel circuits P connected to the scanning signal line.

At time t3, the clock signal CK changes to low level and the clock signal CKB and the reset signal R (an output signal from a unit circuit of a next stage) change to high level. When the reset signal R is brought to high level, the transistors T6 and T7 are placed in on state. When the transistor T6 is placed in on state, the potential at the node N1 is brought to low level and the transistor T4 is placed in off state. When the transistor T7 is placed in on state, the output signal Q is brought to low level. In addition, since the transistor T4 is in off state, when the clock signal CKB is brought to high level, the potential at the node N2 is brought to high level.

At time t4, the clock signal CK changes to high level and the clock signal CKB and the reset signal R change to low level. Accordingly, the transistor T5 is placed in on state and the transistors T6 and T7 are placed in off state. When the transistor T5 is placed in on state, the potential at the node N2 is brought to low level. The low-level potential at the node N2 is applied to the node N1 through the capacitor Cap2.

During a period after time t3 and before the set signal S is brought to high level next (hereinafter, referred to as a non-selected period), the potential at the node N1 remains at low level. Therefore, even if the clock signal CK is brought to high level during the non-selected period, the output signal Q remains at low level. In addition, during the non-selected period, the transistor T4 is always in off state. Therefore, during the non-selected period, the potential at the node N2 is brought to low level when the clock signal CK changes to high level, and is brought to high level when the clock signal CKB changes to high level.

Figure 6:
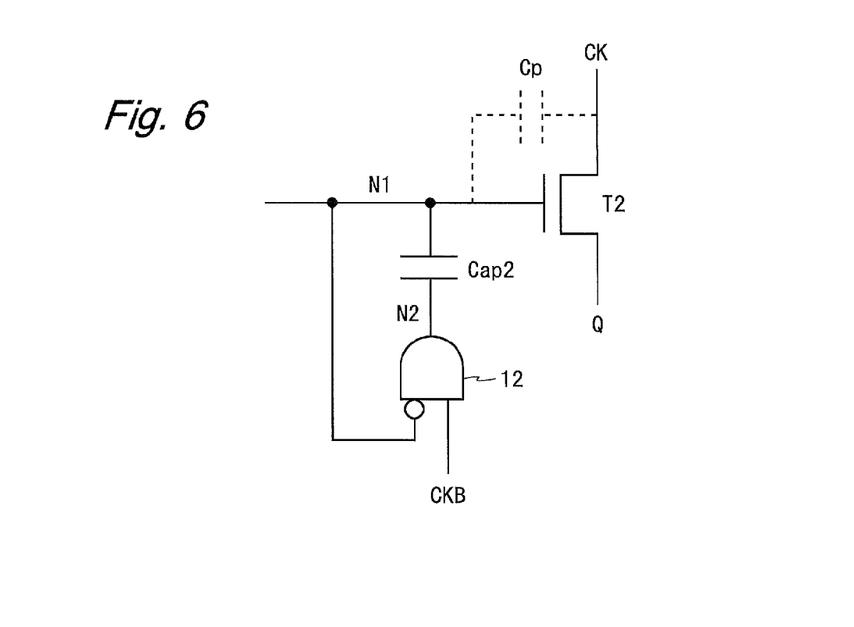
FIG. 6 is a diagram showing a part of the unit circuit shown in FIG. 4.

Due to the action of the transistors T3 to T5, the potential at the node N2 is brought to low level when the potential at the node N1 is at high level, and is equal to the potential of the clock signal CKB when the potential at the node N1 is at low level. FIG. 6 is a diagram showing a part of the unit circuit 11. In FIG. 6, a logic gate 12 having the same function as the transistors T3 to T5 is depicted. One input terminal of the logic gate 12 is connected to the node N1 and the clock signal CKB is provided to the other input terminal. One electrode of the capacitor Cap2 is connected to the node N1, and an output terminal of the logic gate 12 is connected to the other electrode of the capacitor Cap2. As such, the transistors T3 to T5 function as a compensation circuit that provides the clock signal CKB to the other electrode of the capacitor Cap2 when the gate potential of the transistor T2 is at low level, and applies a low-level potential to the other electrode of the capacitor Cap2 when the gate potential is at high level.

Figure 7:
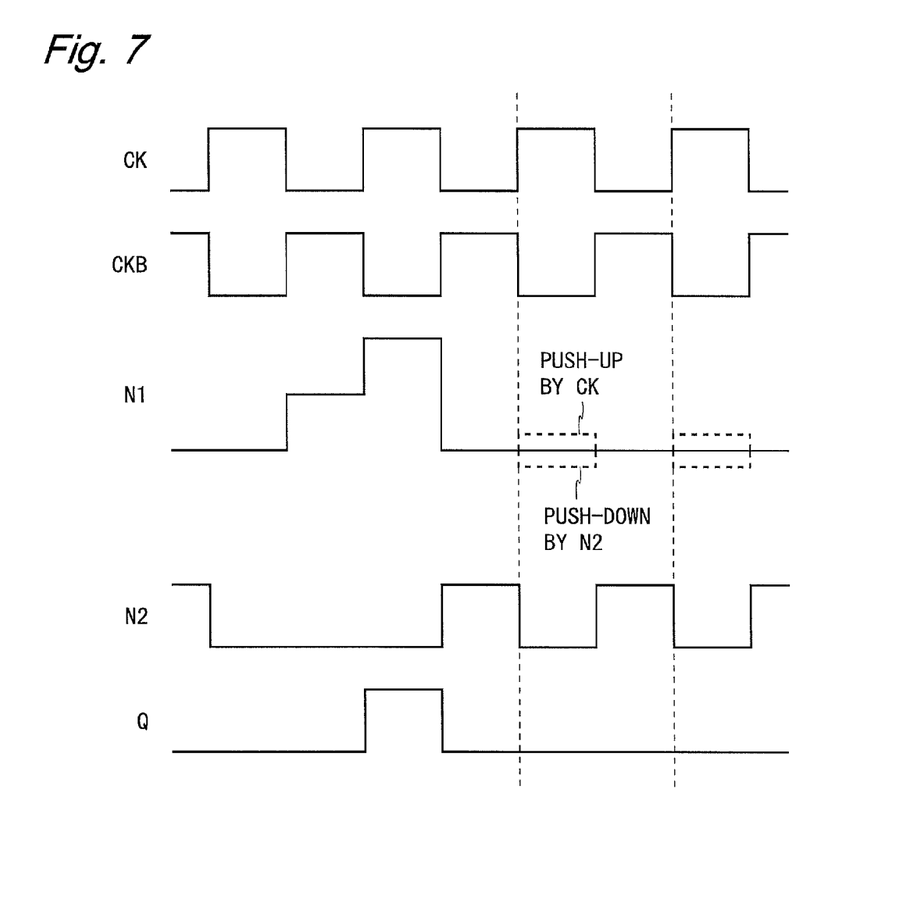
FIG. 7 is a diagram showing a part of the timing chart shown in FIG. 5 in enlargement.

With reference to FIGS. 6 and 7, effects brought about by the shift register 10 according to the present embodiment will be described below. As shown in FIG. 6, a parasitic capacitance Cp occurs between the gate and drain of the transistor T2. Hence, when the clock signal CK changes, the potential at the node N1 also changes through the parasitic capacitance Cp. In particular, when the clock signal CK changes to high level while the potential at the node N1 is at low level, the potential at the node N1 becomes higher than the normal low-level potential (a push-up by the clock signal CK, see FIG. 7). Hence, leakage current of the transistor T2 increases and thus the low-level potential of the output signal Q becomes unstable.

To solve this problem, the unit circuit 11 includes a compensation circuit composed of the transistors T3 to T5; and the capacitor Cap2. The compensation circuit provides the clock signal CKB (a clock signal of opposite phase to a clock signal provided to the transistor T2) to the node N2 when the potential at the node N1 is at low level, and applies the low-level potential to the node N2 when the potential at the node N1 is at high level. The potential at the node N2 is applied to the node N1 through the capacitor Cap2.

As shown in FIG. 7, when the clock signal CK changes to high level, the clock signal CKB changes to low level. Hence, when the clock signal CK changes to high level while the potential at the node N1 is at low level, the potential at the node N2 changes to low level. The low-level potential at the node N2 is applied to the node N1 through the capacitor Cap2. By this, the potential at the node N1 is pulled in a direction in which the potential decreases (a push-down by the node N2). Therefore, by providing the clock signal CKB of opposite phase to the clock signal CK to the node N1 through the capacitor Cap2, a push-up by the clock signal CK is cancelled out by the push-down by the node N2, enabling to stabilize the low-level potential at the node N1. By this, the low-level potential of the output signal Q can be stabilized.

When the clock signal CKB changes while the potential at the node N1 is at high level, the potential at the node N2 remains at low level. Hence, even if the clock signal CKB changes, the potential at the node N1 is not affected thereby. Therefore, the potential at the node N1 becomes higher than the normal high-level potential due to the bootstrap effect and thus the potential of the output signal Q is properly brought to high level.

In the conventional shift register in which the unit circuits 91 shown in FIG. 15 are connected in multi-stage, the low-level potential of the output signal OUT is applied to the node N1 through the transistor Q5. Hence, in the conventional shift register, the capability to stabilize the potential at the node N1 at low level decreases by aging. On the other hand, in the shift register 10 according to the present embodiment, when the low-level potential of the output signal Q is applied to the node N1, the capacitor Cap2 is used. In the capacitor Cap2, an increase in threshold voltage or a decrease in on-current due to aging cannot occur. Therefore, according to the shift register 10 according to the present embodiment, the capability to stabilize the potential at the node N1 can be maintained even after a lapse of a long time.

Note that in the shift register 10 according to the present embodiment the amplitude of the potential of the clock signal CK is substantially equal to the amplitude of the potential at the node N2. Therefore, to effectively prevent a change in the potential at the node N1 associated with a change in the clock signal CK, it is preferred that the capacitor Cap2 have a capacitance comparable to that of the parasitic capacitance Cp between the gate and drain of the transistor T2.

(Second Embodiment)

A shift register according to a second embodiment of the present invention has the same configuration (FIG. 2) as the shift register according to the first embodiment and includes unit circuits different than those of the shift register according to the first embodiment. Differences between the present embodiment and the first embodiment will be described below.

Figure 8:
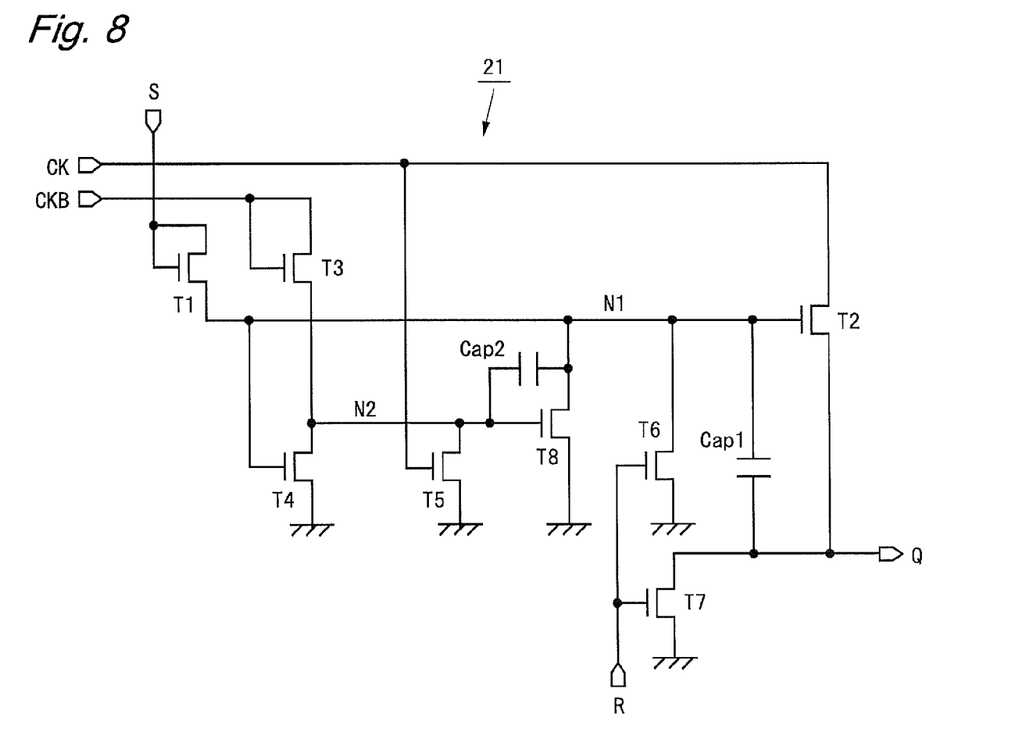
FIG. 8 is a circuit diagram of a unit circuit of a shift register according to a second embodiment of the present invention.

FIG. 8 is a circuit diagram of a unit circuit included in a shift register according to the present embodiment. A unit circuit 21 shown in FIG. 8 is such that a transistor T8 is added to the unit circuit 11 according to the first embodiment (FIG. 4). The drain terminal of the transistor T8 is connected to the node N1 and the gate terminal is connected to the node N2. The low-level potential VSS is fixedly applied to the source terminal of the transistor T8. The transistor T8 applies the low-level potential to the node N1 when the potential at the node N2 is at high level.

Figure 9:
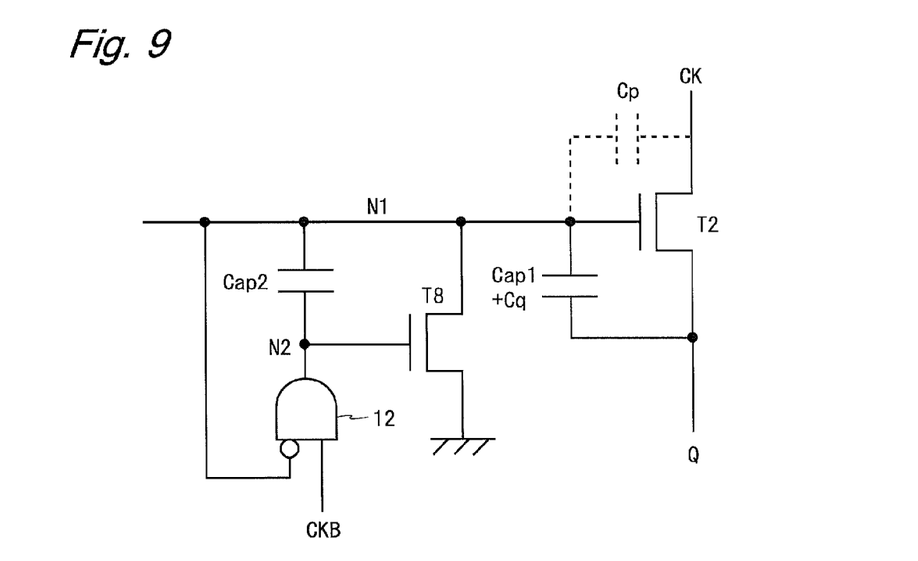
FIG. 9 is a diagram showing a part of the unit circuit shown in FIG. 8.

FIG. 9 is a diagram showing a part of the unit circuit 21. In the unit circuit 21, the capacitor Cap1 is provided between the gate and source of the transistor T2 and the parasitic capacitance Cp occurs between the gate and drain of the transistor T2. In addition, a parasitic capacitance Cq also occurs between the gate and source of the transistor T2. In FIG. 9, the capacitor Cap1 and the parasitic capacitance Cq are depicted as a single capacitor.

As described above, when the clock signal CK provided to the drain terminal of the transistor T2 changes, the potential at the node N1 changes through the parasitic capacitance Cp. In addition to this, when the output signal Q outputted from the source terminal of the transistor T2 changes, too, the potential at the node N1 changes through the capacitor Cap1 and the parasitic capacitance Cq. In particular, when the output signal Q slightly increases while the potential at the node N1 is at low level and the output signal Q is at low level, the potential at the node N1 becomes higher than a normal low-level potential (a push-up by the output signal Q). The timing at which a push-up by the clock signal CK occurs is different from the timing at which the push-up by the output signal Q occurs. Hence, in the shift register 10 according to the first embodiment, the gate potential of a transistor T2 may change due to the push-up by an output signal Q.

In view of this, the shift register according to the present embodiment includes the unit circuits 21, each including the transistor T8. The transistor T8 applies the low-level potential to the node N1 when the potential at the node N2 is at high level. Therefore, according to the shift register according to the present embodiment, even in the case in which not only the push-up by the clock signal CK but also the push-up by the output signal Q occurs, the low-level potential at the node N1 can be stabilized.

Figure 10A:
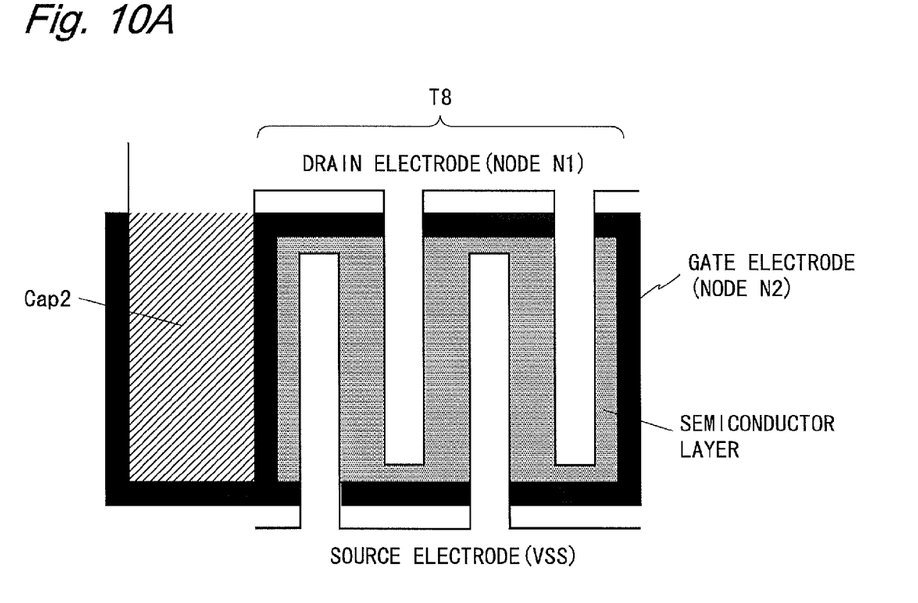
FIG. 10A is a layout diagram (first example) of a transistor and a capacitor which are included in the unit circuit shown in FIG. 8.
Figure 10B:
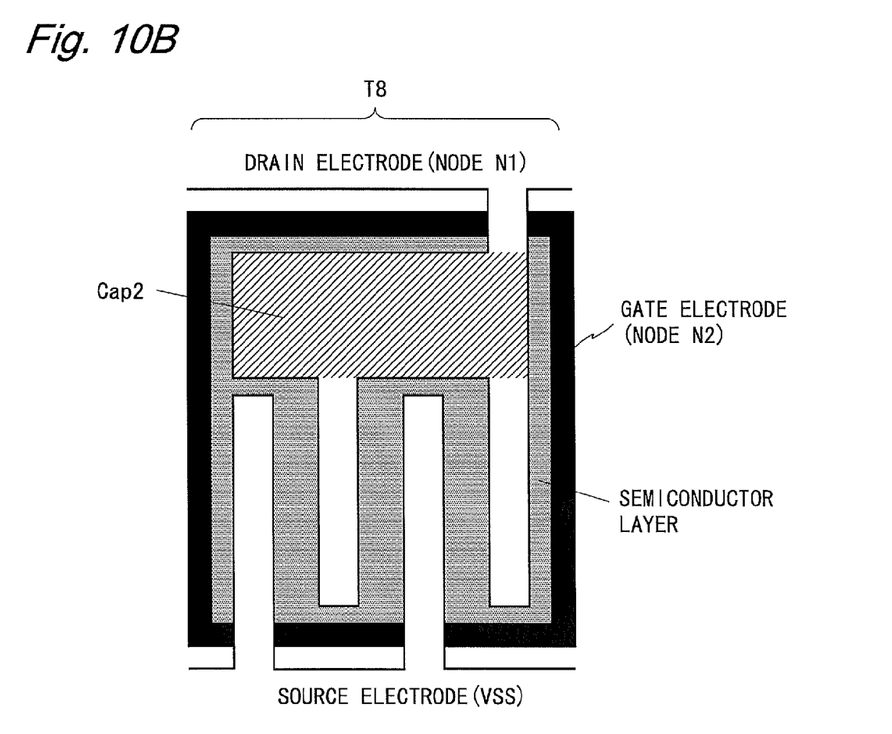
FIG. 10B is a layout diagram (second example) of a transistor and a capacitor which are included in the unit circuit shown in FIG. 8.

Note that when TFTs included in the unit circuits 21 are formed of bottom-gate transistors, as shown in FIG. 10A, the transistor T8 and the capacitor Cap2 maybe formed separately. Alternatively, as shown in FIG. 10B, a parasitic capacitance between the drain electrode (node N1) and gate electrode (node N2) of the transistor T8 may be increased and the parasitic capacitance may be used as the capacitor Cap2.

(Third Embodiment)

Figure 11:
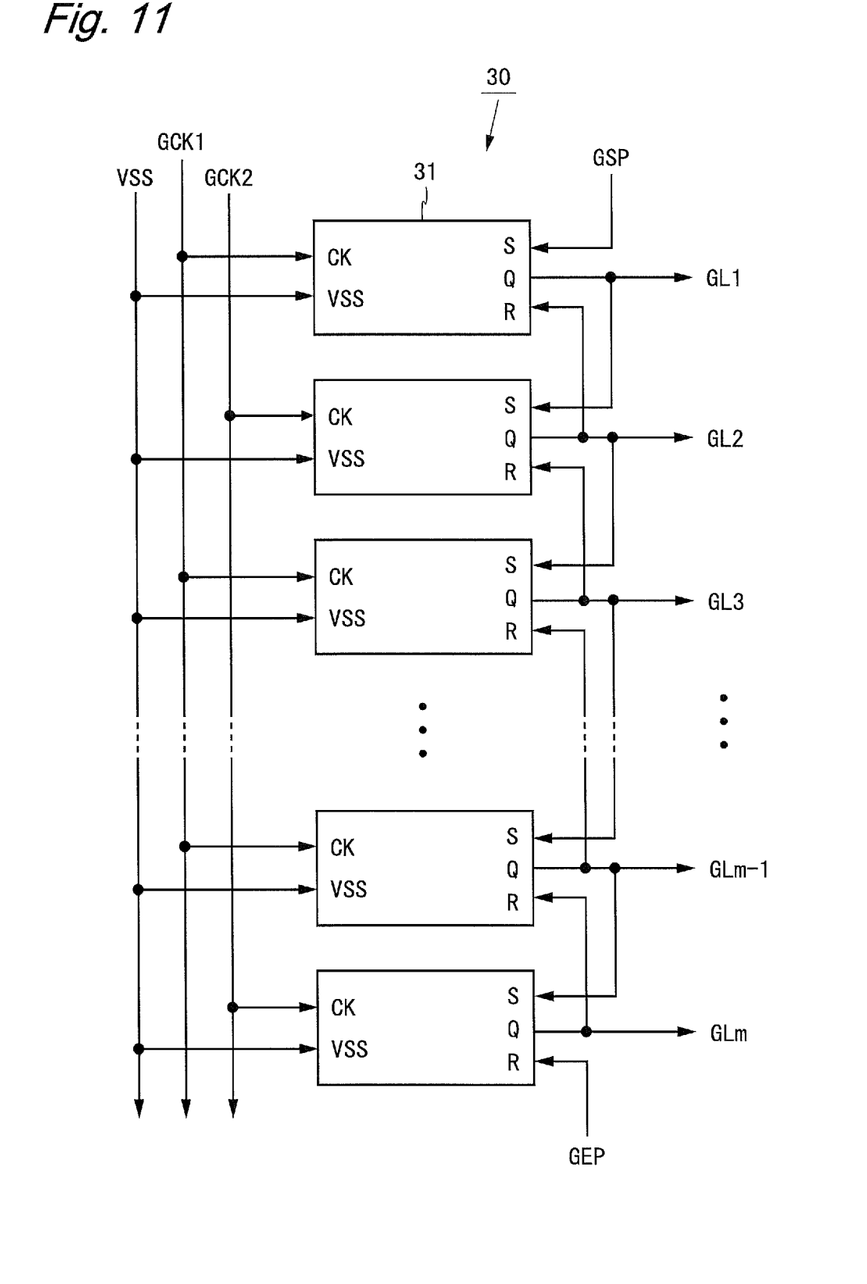
FIG. 11 is a block diagram showing a configuration of a shift register according to a third embodiment of the present invention.

FIG. 11 is a block diagram showing a configuration of a shift register according to a third embodiment of the present invention. A shift register 30 shown in FIG. 11 includes m unit circuits 31 arranged side by side one-dimensionally. Differences between the present embodiment and the first embodiment will be described below.

A clock signal CK, a set signal S, a reset signal R, and a low-level potential VSS are inputted to each unit circuit 31 and an output signal Q is outputted from each unit circuit 31. A gate clock signal GCK1 is inputted to the odd-numbered unit circuits as the clock signal CK. A gate clock signal GCK2 is inputted to the even-numbered unit circuits as the clock signal CK.

Figure 12:
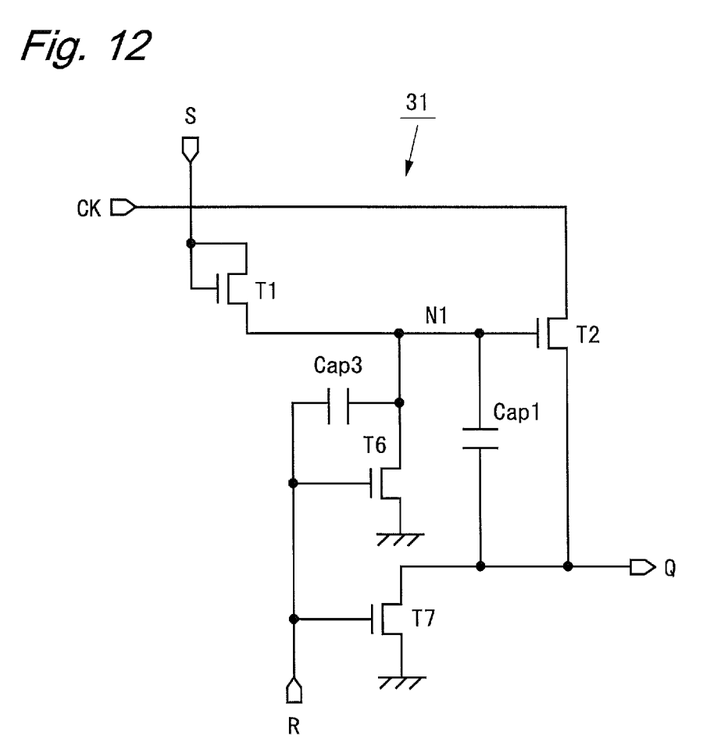
FIG. 12 is a circuit diagram of a unit circuit of the shift register shown in FIG. 11.

FIG. 12 is a circuit diagram of the unit circuit 31. The unit circuit 31 shown in FIG. 12 is such that the transistors T3 to T5 and the capacitor Cap2 are removed from the unit circuit 11 according to the first embodiment (FIG. 4) and a capacitor Cap3 is added. One electrode of the capacitor Cap3 is connected to the node N1, and the reset signal R (an output signal from a unit circuit of a next stage) is provided to the other electrode.

Figure 13:
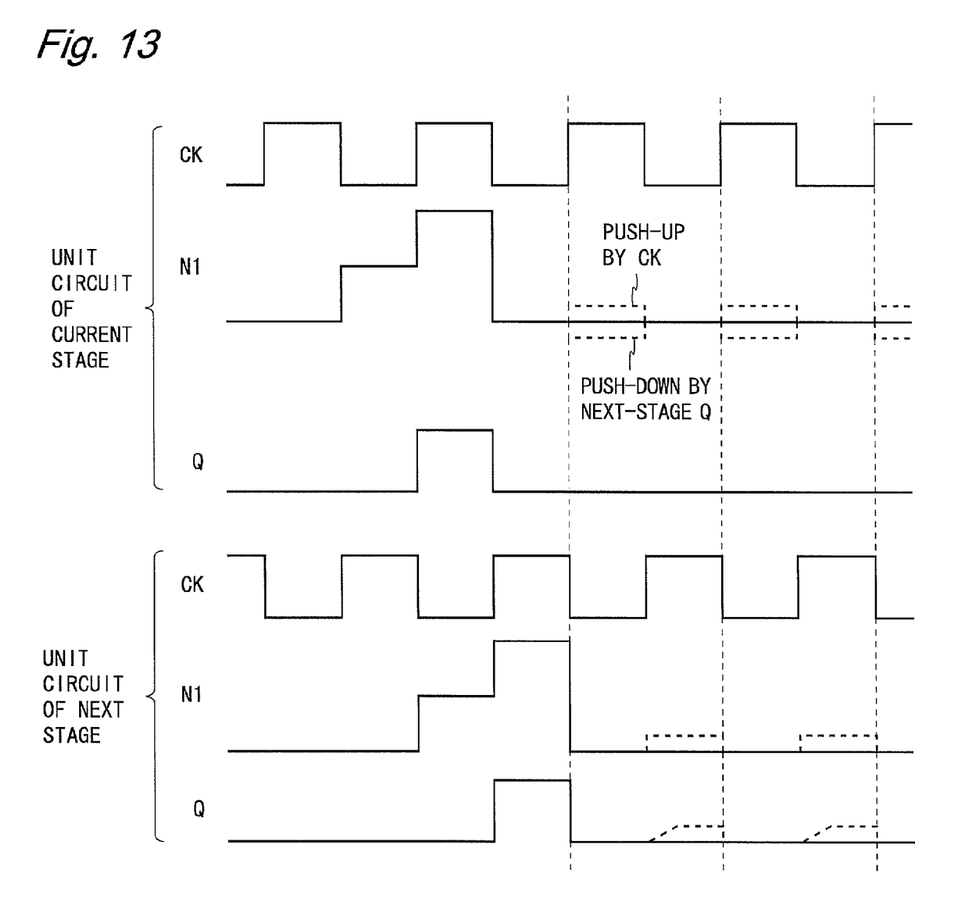
FIG. 13 is a timing chart of the shift register shown in FIG. 11.

FIG. 13 is a timing chart of the shift register 30. In the shift register 30, the capacitor Cap3 is provided between a node N1 in a unit circuit of a certain stage (hereinafter, referred to as a unit circuit of a current stage) and an output terminal Q of a unit circuit of a next stage. An output signal Q from the unit circuit of the next stage is provided to the node N1 in the unit circuit of the current stage through the capacitor Cap3.

The output signal Q from the unit circuit of the next stage changes to low level when the clock signal CK provided to the unit circuit of the current stage changes to high level. When the output signal Q from the unit circuit of the next stage changes to low level, the potential at the node N1 in the unit circuit of the current stage is pulled in a direction in which the potential decreases (a push-down by the output signal Q from the unit circuit of the next stage, see FIG. 13). Therefore, by providing the output signal Q from the unit circuit of the next stage to the node N1 in the unit circuit of the current stage through the capacitor Cap3, a push-up by the clock signal CK is cancelled out by a push-down by the output signal Q from the unit circuit of the next stage, enabling to stabilize the low-level potential at the node N1.

It is assumed that the low-level potential of the output signal Q from the unit circuit of the next stage becomes unstable due to the push-up by the clock signal. The output signal Q from the unit circuit of the next stage changes to low level when the clock signal CK provided to the unit circuit of the next stage changes to low level (i.e., when a clock signal provided to the unit circuit of the current stage changes to high level). At this time, too, the potential at the node N1 in the unit circuit of the current stage is pulled in a direction in which the potential decreases. Therefore, by a push-down occurring when the output signal Q from the unit circuit of the next stage returns to a normal low level, the push-up by the clock signal CK is cancelled out, whereby the low-level potential at the node N1 can also be stabilized.

Figure 14A:
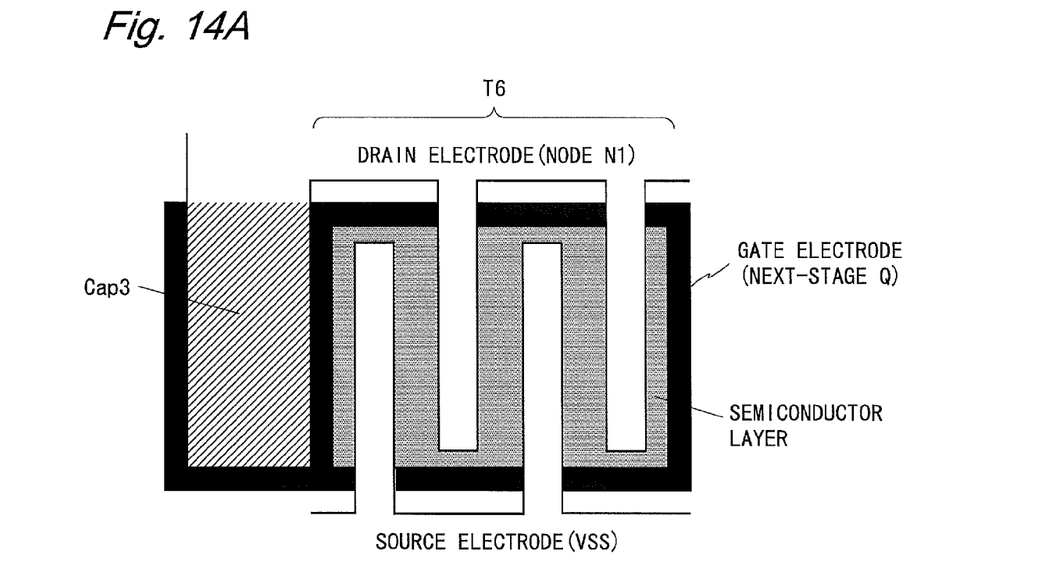
FIG. 14A is a layout diagram (first example) of a transistor and a capacitor which are included in the unit circuit shown in FIG. 12.
Figure 14B:
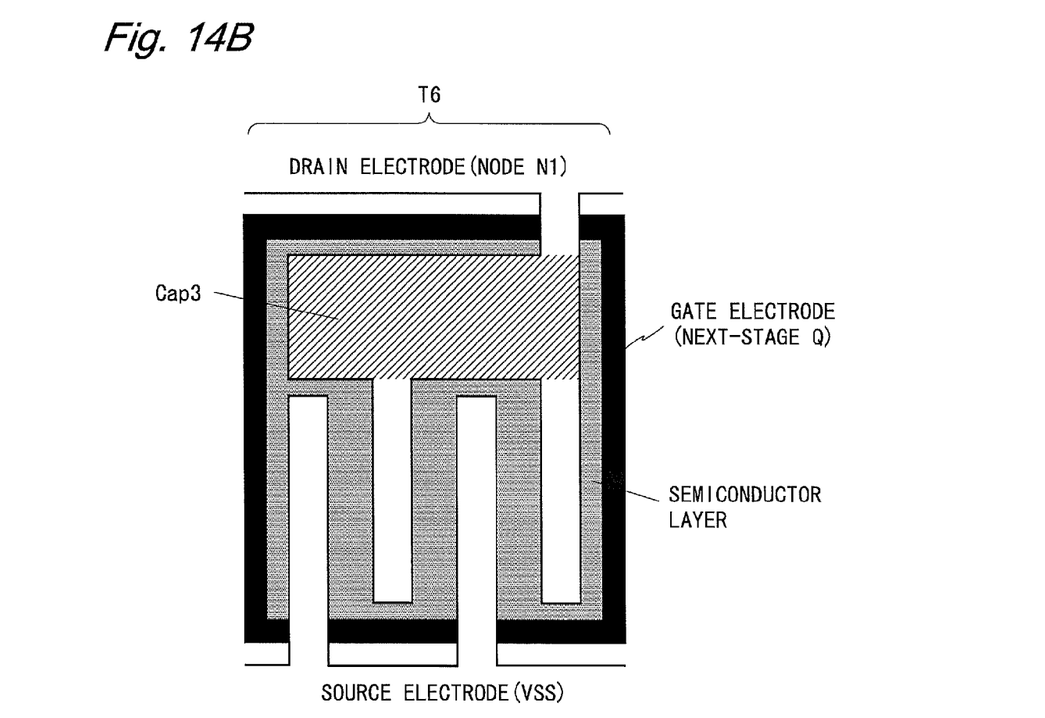
FIG. 14B is a layout diagram (second example) of a transistor and a capacitor which are included in the unit circuit shown in FIG. 12.

Note that when TFTs included in the unit circuits 31 are formed of bottom-gate transistors, as shown in FIG. 14A, the transistor T6 and the capacitor Cap3 may be formed separately. Alternatively, as shown in FIG. 14B, a parasitic capacitance between the drain electrode (node N1) and gate electrode (next-stage Q) of the transistor T6 may be increased and the parasitic capacitance may be used as the capacitor Cap3.

Although, in the above description, shift registers according to the embodiments of the present invention are used as scanning signal line drive circuits of liquid crystal display devices, the shift registers can also be used in display devices other than liquid crystal display devices, imaging devices, or the like.

As shown above, according to shift registers of the present invention, by providing to a control terminal of an output transistor a signal that stabilizes an off-potential at the control terminal of the output transistor through a capacitor, fluctuations in the potential at the control terminal of the output transistor occurring when a clock signal changes can be prevented.

Industrial Applicability

Shift registers of the present invention have a feature that they can prevent fluctuations in the potential at a control terminal of an output transistor occurring when a clock signal changes and thus can be used in, for example, drive circuits of display devices and imaging devices, or the like.

Description of Reference Characters
 1: POWER SUPPLY
 2: DC/DC CONVERTER
 3: DISPLAY CONTROL CIRCUIT
 4: SCANNING SIGNAL LINE DRIVE CIRCUIT
 5: VIDEO SIGNAL LINE DRIVE CIRCUIT
 6: COMMON ELECTRODE DRIVE CIRCUIT
 7: PIXEL REGION
 8: LIQUID CRYSTAL PANEL
 10 and 30: SHIFT REGISTER
 11, 21, and 31: UNIT CIRCUIT
 12: LOGIC GATE

The invention claimed is:

1. A shift register that has a configuration in which a plurality of unit circuits are connected in multi-stage, and that operates based on a plurality of clock signals, wherein
   each of the unit circuits includes:
      an output transistor including a control terminal, a first conduction terminal to which a clock signal is provided, and a second conduction terminal connected to an output node;
      a set transistor that applies an on-potential to the control terminal of the output transistor, according to a set signal provided thereto;
      a reset transistor that applies an off-potential to the control terminal of the output transistor, according to a reset signal provided thereto;
      a capacitor including one electrode connected to the control terminal of the output transistor and including another electrode connected to a first node; and
      a compensation circuit that provides an opposite-phase clock signal of opposite phase to the clock signal provided to the output transistor, to the first node when a control terminal potential of the output transistor is an off-potential, and applies an off-potential to the first node when the control terminal potential is an on-potential, in order to prevent a change in the control terminal potential of the output transistor associated with a change in the clock signal.

2. The shift register according to claim 1, wherein the compensation circuit includes a first transistor that applies an off-potential to the first node, according to the clock signal;
   a second transistor that applies an on-potential to the first node, according to the opposite-phase clock signal; and
   a third transistor that applies an off-potential to the first node when the control terminal potential of the output transistor is an on-potential.

3. The shift register according to claim 2, wherein the compensation circuit further includes a fourth transistor that applies an off-potential to the control terminal of the output transistor when a potential at the first node is an on-potential.

4. The shift register according to claim 1, wherein the capacitor includes a capacitance comparable to that of a parasitic capacitance between the first conduction terminal and the control terminal of the output transistor.

5. The shift register according to claim 1, wherein the transistors included in the unit circuit are composed of bottom-gate transistors, and
   the capacitor is formed separately from the transistors connected to the control terminal of the output transistor.

6. The shift register according to claim 1, wherein the transistors included in the unit circuit are composed of bottom-gate transistors, and
   the capacitor is formed as a parasitic capacitance between a control terminal and one conduction terminal of a transistor connected to the control terminal of the output transistor.

7. The shift register according to claim 1, wherein the unit circuit further includes an output reset transistor that applies an off-potential to the output node, according to the reset signal.

* * * * *